United States Patent
Campbell et al.

(10) Patent No.: US 6,618,941 B2
(45) Date of Patent: Sep. 16, 2003

(54) METHOD OF FORMING FREESTANDING METAL DENDRITES

(75) Inventors: Jeffrey S. Campbell, West Bloomfield, MI (US); William T. Wike, Endicott, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/928,633

(22) Filed: Aug. 13, 2001

(65) Prior Publication Data

US 2002/0027016 A1 Mar. 7, 2002

Related U.S. Application Data

(62) Division of application No. 09/371,290, filed on Aug. 10, 1999, now Pat. No. 6,323,432.

(51) Int. Cl.⁷ .............................. H05K 3/02; H05K 3/10
(52) U.S. Cl. ....................... 29/846; 29/830; 174/149 R; 439/66; 117/903; 200/511
(58) Field of Search .................... 29/830, 832, 837, 29/846, 852; 174/149 R; 200/511; 264/174.11; 428/625; 439/66; 117/903

(56) References Cited

U.S. PATENT DOCUMENTS

| | | | |
|---|---|---|---|
| 4,449,774 A | 5/1984 | Takashi et al. | 359/59 M |
| 4,707,418 A * | 11/1987 | Takiar et al. | 228/180.22 |
| 4,740,657 A | 4/1988 | Tsukagoshi et al. | 174/88 R |
| 4,814,040 A | 3/1989 | Ozawa | 156/634 |
| 4,902,857 A | 2/1990 | Cranston et al. | 174/94 R |
| 5,001,302 A | 3/1991 | Atsumi | 174/94 R |
| 5,019,944 A | 5/1991 | Ishii et al. | 361/400 |
| 5,045,249 A | 9/1991 | Jin et al. | 264/24 |
| 5,061,192 A | 10/1991 | Chapin et al. | 439/66 |
| 5,137,461 A | 8/1992 | Bindra et al. | 439/74 |
| 5,163,834 A | 11/1992 | Chapin et al. | 439/66 |
| 5,185,073 A | 2/1993 | Bindra et al. | 205/104 |
| 5,213,715 A | 5/1993 | Patterson et al. | 252/518 |
| 5,248,262 A | 9/1993 | Busacco et al. | 439/66 |
| 5,338,532 A | 8/1994 | Tomalia et al. | 424/1.49 |
| 5,431,571 A | 7/1995 | Hanrahan et al. | 439/91 |
| 5,527,524 A | 6/1996 | Tomalia et al. | 424/1.33 |
| 5,600,259 A | 2/1997 | Bartyzel et al. | 324/761 |
| 5,613,862 A | 3/1997 | Naylor | 439/91 |
| 5,636,996 A | 6/1997 | Johnson et al. | 439/66 |
| 6,043,336 A * | 3/2000 | Miller et al. | 424/DIG. 16 |
| 6,262,696 B1 * | 7/2001 | Seraphim et al. | 345/1.3 |

FOREIGN PATENT DOCUMENTS

JP           401198092 A    8/1989

* cited by examiner

*Primary Examiner*—Richard Chang
(74) *Attorney, Agent, or Firm*—William N. Hogg

(57) ABSTRACT

A technique for making acicular, branched, conductive dendrites, and a technique for using the dendrites to form a conductive compressible pad-on-pad connector are provided. To form the dendrites, a substrate is provided on which dendrites are grown, preferably on a metal film. The dendrites are then removed from the substrate, preferably by etching metal from the substrate. The so formed dendrites are incorporated into a compressible dielectric material, which then forms a compressible pad-on-pad connector between two conducting elements, such as connector pads on electrical devices, e.g. an I/C chip mounted on a substrate, such as a chip carrier.

13 Claims, 2 Drawing Sheets

METHOD OF FORMING FREESTANDING METAL DENDRITES

CROSS REFERENCE TO RELATED APPLICATION

This application is a divisional of application Ser. No. 09/371,290, filed Aug. 10, 1999 now U.S. No. 6,323,432.

FIELD OF THE INVENTION

This invention relates generally to the manufacture of dendritic particles, and the use thereof and, more particularly, to the manufacture of acicular branched metal dendritic particles, and the use thereof.

BACKGROUND INFORMATION

Traditionally, springs and pins have been used to provide connection between electrical elements such as pads. However, as densities increase, these types of connections are often not sufficient. With higher densities, compressible pad-on-pad connections are often used. While in many cases these types of connectors are very useful, nevertheless in some instances they are not completely reliable. For example, when the pads or other contacts have films, such as oxide films or the like or dust particles, or any other surface contaminants, or connectors that use a conductive elastomer/plastic material, such conductive elastomers may not provide the necessary contact with the pads. This is because the conductive elastomer is normally provided with relatively soft metal conducting particles, such as silver. When the particles encounter the film, they may not penetrate the film, but rather deform, leaving the film as an insulating barrier between the conductive pad and the conductive particles. This sometimes results in less than the quality connection required.

SUMMARY OF THE INVENTION

According to the present invention, a technique for making acicular, branched, conductive dendrites, and a technique for using the dendrites to form a conductive compressible pad-on-pad connector are provided. To form the dendrites, a substrate is provided on which dendrites are grown, preferably on a metal film. The dendrites are then removed from the substrate, preferably by etching metal from the substrate. The so formed dendrites are incorporated into a compressible dielectric material, which then forms a compressible pad-on-pad connector between two conducting elements, such as connector pads on electrical devices, e.g. an I/C chip mounted on a substrate, such as a chip carrier.

DESCRIPTION OF THE PREFERRED EMBODIMENT

A method of forming branched, acicular, dendrite particles according to one embodiment of this invention is shown, somewhat diagrammatically, in FIGS. 1–6.

Figure 1:
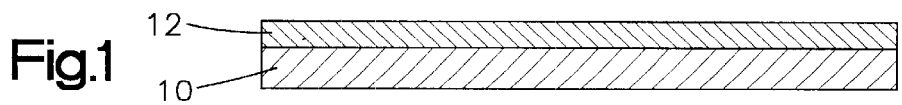
FIGS. 1–6 show diagrammatically the steps in forming dendrite particles according to this invention.

As shown in FIG. 1, a titanium substrate 10 is provided on which a copper coating 12 is applied. The copper layer 12 preferably is about 0.0002 inches thick. The copper can either be laminated or plated onto the substrate using conventional laminating or plating techniques well known to those skilled in the art. For example, conventional electroplating using an acid copper bath to deposit 0.2 mil thick copper on the titanium substrate gives good results.

Figure 2:
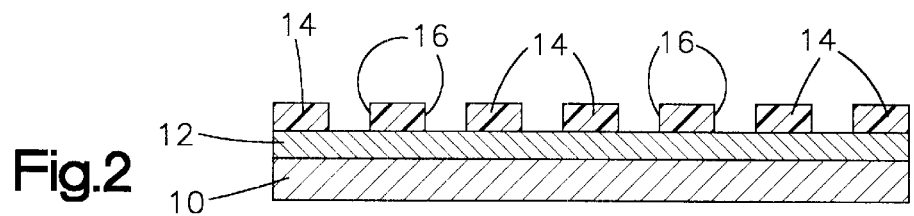

As seen in FIG. 2, a coating of photoresist 14 is applied to the copper coating 12. The photoresist is exposed and developed according to standard photolithographic techniques to form openings 16 extending to the copper layer 12 where dendrite particles are to be formed. The photoresist can be either negative acting or positive acting. Preferably, the photoresist is a negative acting photoresist of the type sold by DuPont under the designation 330R.

Figure 3:
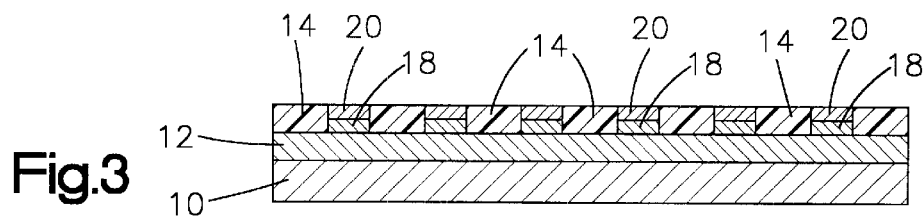

As can be seen in FIG. 3, following the patterning of the photoresist 14, a layer of nickel 18, preferably about 0.0001 inch thick, and a layer of palladium 20 (if palladium dendrites are to be formed) preferably about 0.0001 inch thick, are plated onto the copper layer 12 in the openings 16. Standard plating techniques, well known to those skilled in the art, are used to plate the nickel and palladium. Conventional nickel sulfamate baths can be used to plate nickel. SEL-REX palladium off the shelf plating chemicals sold by Enthone Corp. can be used for plating palladium. The nickel 18 serves as a barrier to copper migration and contamination and the palladium 20 serves as the base on which the palladium dendrites are to be grown.

Figure 4:
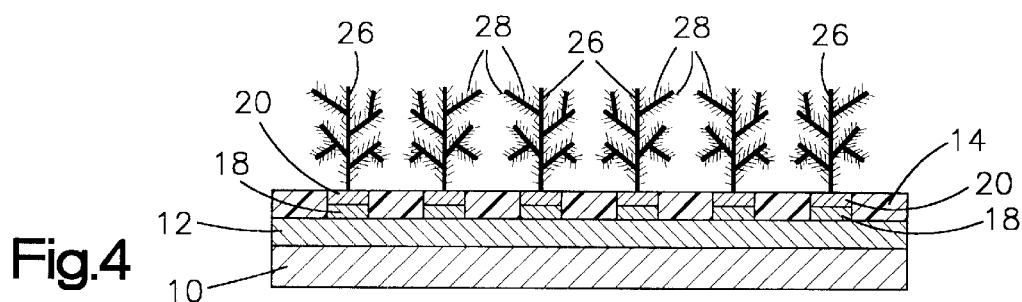

As seen in FIG. 4, palladium dendrites 26 are grown on the exposed palladium layer 20. These dendrites are preferably grown using generally the technique described in commonly assigned U.S. Pat. No. 5,137,461. (As described in this patent, other materials, such as platinum, rhodium, iridium, ruthenium, osmium, tungsten and copper can be used to form dendrites. The techniques for growing such dendrites of other materials are also disclosed in U.S. Pat. No. 5,137,461.)

Specifically, the technique for forming dendrites, according to this invention, involves the modification of the dendrite plating process disclosed in U.S. Pat. No. 5,137,461 to produce a more branched acicular dendrite which can be separated into singular dendritic particles which can then be incorporated into a compressible dielectric material. The acicular, branched dendrite is formed by modifying the growth rate of the dendrite at or near the top height of the resist window. It was observed that as long as the spindle-like dendrite growth occurs within the well formed by the resist walls, growth will be uniform and more spire-like with few branches. As it approaches the top of the resist window, the agitation effects of the panel movement and solution sparging, as disclosed in U.S. Pat No. 5,137,461, start to provide second order effects which cause the dendrites to form multiple branches. If the plating is not controlled and stopped in time, the branches within a dendrite matrix grow together and form a more solid matrix of connected branches, which is undesirable. The technique utilized in this invention controls the height of the dendrite to be equal to or slightly greater than the height of the resist wall. It is accomplished by controlling the bath time, agitation rates and ultrasonic pulse to achieve uniform growth of singular branched dendrites which have a single point of connection to the previously mentioned metal substrate.

The resulting structure is a branched, acicular, tree-like dendrite structure 26 having sharp points 28 at the ends of the branches, thus resulting in a needle-like structure with the needles oriented in different directions.

Figure 5:
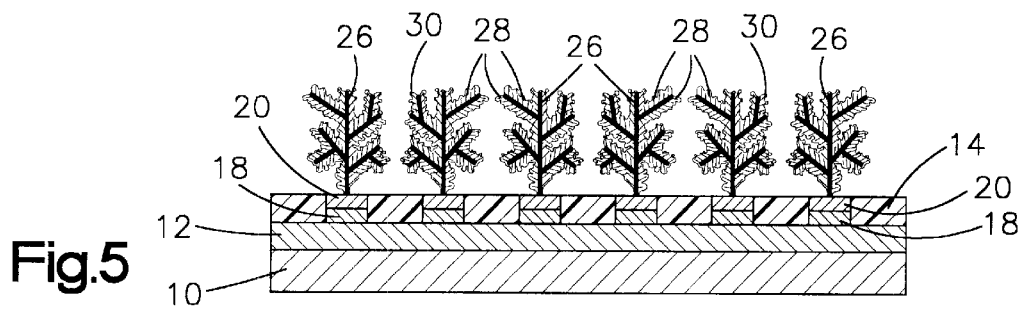

Following the growing of the dendrites 26, as shown in FIG. 4, preferably the grown dendrites are plated with a coating of palladium 30, about 0.0001 inches thick, by well known plating techniques as shown in FIG. 5. This is to add strength and rigidity to the dendrites 26, since the as-grown microstructure of the dendrites 26 may result in a weaker microstructure than a plated microstructure.

Figure 6:
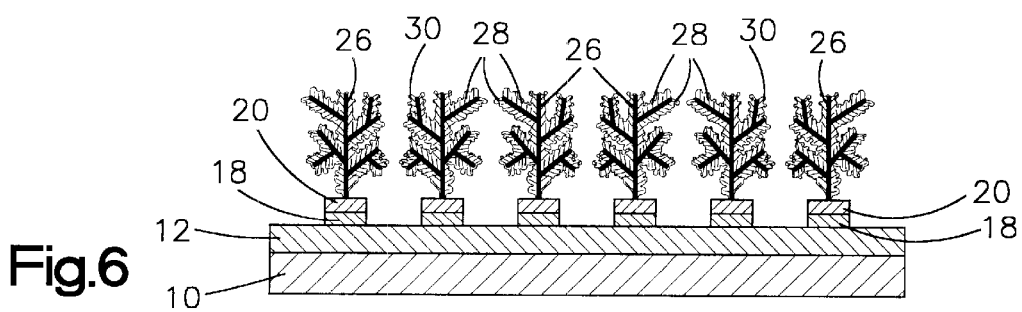
Figure 7:
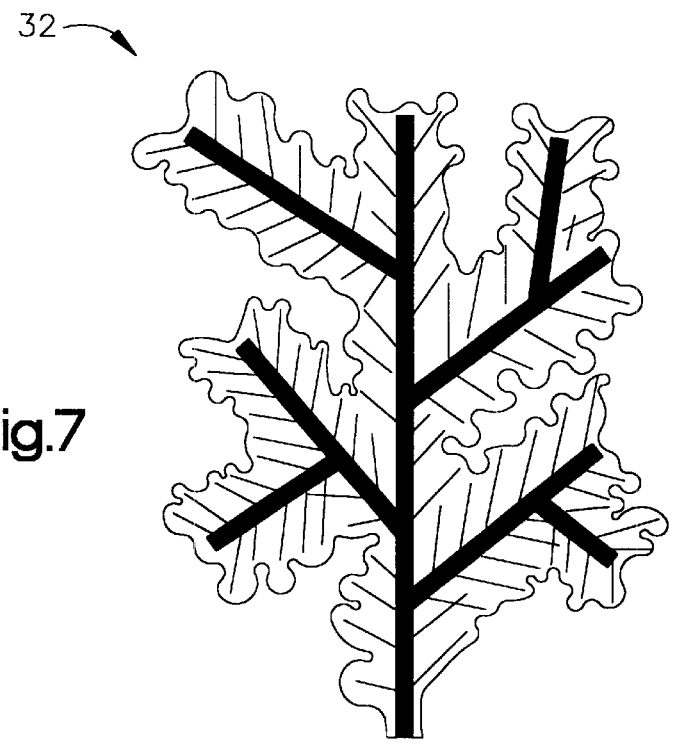
FIG. 7 shows a dendrite particle formed according to this invention and detached from the substrate on which it was formed.

Following the plating of the palladium 30, the photoresist 14 is stripped to reveal the etched copper layer 12 therebelow, as seen in FIG. 6. The copper is then etched off using a copper etchant such as persulfate or cupric chloride to remove the dendrites. A resulting dendrite 32 is shown in FIG. 7.

Alternatively, an organic base such as a polyimide on which copper is sputtered to form the copper base can be employed instead of the titanium. The process then proceeds as described above for the plating of the dendrites. Then either the copper is etched away or the organic base dissolved in any suitable solvent to produce the dendrites.

As indicated earlier, the dendrites are branched, acicular structures, having a tree-like or needle-like configuration with the ends of the branches being pointed and sharp, and oriented in different directions. This configuration makes the dendrites especially useful in forming conductive pad-on-pad conducting connectors.

Figure 8:
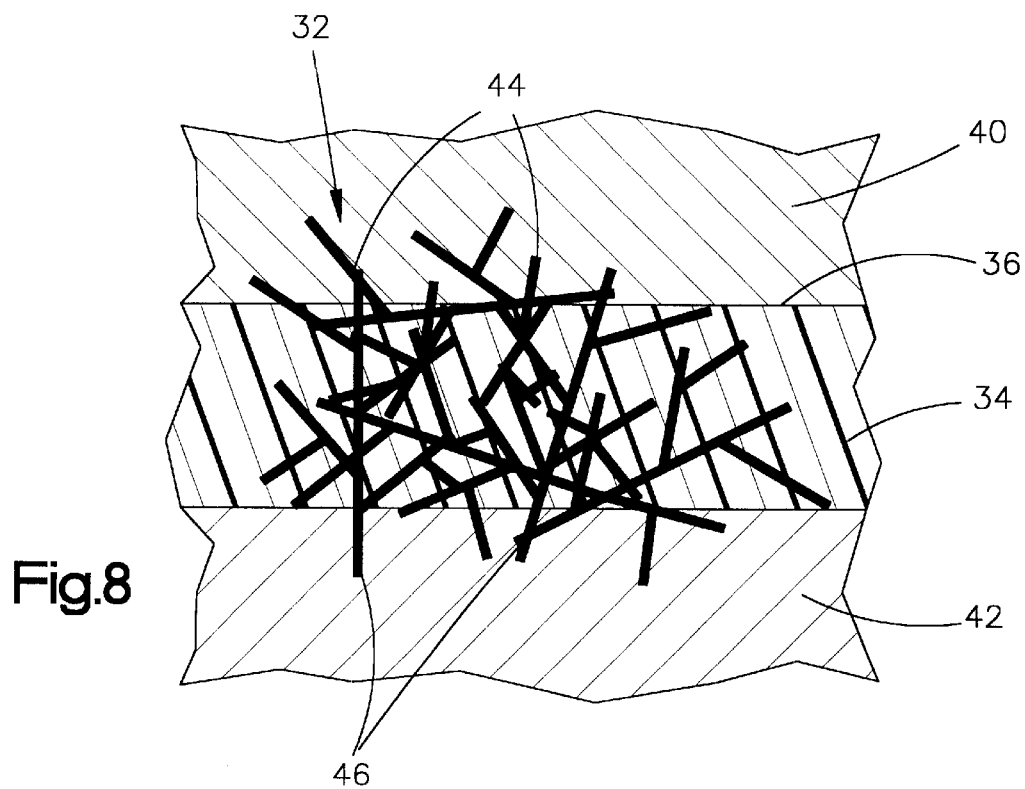
FIG. 8 depicts, somewhat diagrammatically, a compressible dielectric material having dendrite particles embedded therein according to this invention and disposed between a pair of conducting pads.

Referring now to FIG. 8, the plated dendrites 32, formed according the above-described technique, are shown as used to form a pad-on-pad conductor. The dendrites 32 are dispersed in a compressible dielectric material 34. Such dielectric materials include epoxies, acrylics, polyimides, and the like. Generally, any compressible dielectric material which allows the dendrites to mix in a generally homogenous fashion prior to final cure can be used. A particularly useful material is a flouro-silicon sold by General Electric Corporation under the trademark FSE-7140. There are sufficient dendrites dispersed in the material 34 that a continuous conducting path is provided from one surface 36 to the opposite surface 38 of the material 34. One particular preferred use of conductive compressible matter is to provide pad-on-pad connections of pads 40 on I/C chips (not shown) to pads 42 on a chip carrier (not shown).

The acicular structure of the dendrites, with the pointed ends, allows the dendrites which project from the surfaces of the material 36 and 38 upon compression of the material, to penetrate any film that might be formed on the surface of the pads 40, 44, and make electrical connection with the metal of the pads beneath the film. Thus, the dendrites 32 form a continuous conducting path between the metal of the pads 40 and the metal of the pads 44.

What is claimed is:

1. A method of forming free standing metal dendrites comprising the steps of:

providing a substrate on which said dendrites can be grown;

growing dendrites on said substrate;

removing said grown dendrites from said substrate; and dispersing said dendrites in a compressible dielectric material.

2. The method as defined in claim 1 wherein said substrate includes a metal.

3. The method as defined in claim 2 wherein said step of removing the grown dendrites from the substrate includes etching the metal.

4. The method as defined in claim 3 wherein the metal is copper.

5. The method as defined in claim 4 wherein a second layer of metal overlies said copper.

6. The method as defined in claim 5 wherein said second metal is palladium.

7. The method as defined in claim 5 wherein said dendrites are grown on said second metal.

8. The method as defined in claim 1 wherein said dendrites are branched acicular structures.

9. The method as defined in claim 1 wherein the dendrites are formed at least in pert from palladium.

10. The method as defined in claim 1 further comprising providing a plurality of spaced sites on said substrate where said dendrites are grown.

11. The method as defined in claim 10 wherein said plurality of sites are formed using a photoresist coating and forming openings to define said sites in said photoresist by photolithography.

12. The method as defined in claim 1 wherein said compressible dielectric material is selected from the group of epoxies, acrylics, and polyimides.

13. The method as defined in claim 1 wherein said compressible material is a flouro-silicon.

* * * * *